United States Patent
Kwak et al.

(10) Patent No.: US 9,612,379 B2
(45) Date of Patent: Apr. 4, 2017

(54) WIRE GRID POLARIZER AND METHOD OF FABRICATING THE SAME

(71) Applicant: Samsung Display Co. Ltd., Yongin, Gyeonggi-Do (KR)

(72) Inventors: Eun Ae Kwak, Gunpo-si (KR); Min Hyuck Kang, Seoul (KR); Hyeong Gyu Jang, Asan-si (KR)

(73) Assignee: Samsung Display Co., Ltd. (KR)

( * ) Notice: Subject to any disclaimer, the term of this patent is extended or adjusted under 35 U.S.C. 154(b) by 136 days.

(21) Appl. No.: 14/704,667

(22) Filed: May 5, 2015

(65) Prior Publication Data

US 2016/0178822 A1 Jun. 23, 2016

(30) Foreign Application Priority Data

Dec. 18, 2014 (KR) .................. 10-2014-0182935

(51) Int. Cl.
| | |
|---|---|
| *H01L 27/12* | (2006.01) |
| *G02B 5/30* | (2006.01) |
| *G02B 1/18* | (2015.01) |
| *G02F 1/1335* | (2006.01) |

(52) U.S. Cl.
CPC ............. *G02B 5/3058* (2013.01); *G02B 1/18* (2015.01); *H01L 27/124* (2013.01); *G02F 2001/133548* (2013.01)

(58) Field of Classification Search
CPC ... H01L 29/66; H01L 29/66757; H01L 29/78; H01L 29/78621; H01L 27/12; H01L 27/1214
USPC .......................................................... 257/72
See application file for complete search history.

(56) References Cited

U.S. PATENT DOCUMENTS

| | | | | |
|---|---|---|---|---|
| 6,537,920 B1* | 3/2003 | Krivokapic | ......... | H01L 21/0274 257/E21.027 |
| 2014/0158664 A1 | 6/2014 | Kwak et al. | | |
| 2016/0077264 A1 | 3/2016 | Kang | | |

FOREIGN PATENT DOCUMENTS

| | | |
|---|---|---|
| JP | 08-021906 | 1/1996 |
| KR | 10-2006-0070810 | 6/2006 |
| KR | 10-2012-0033583 | 4/2012 |
| KR | 10-2013-0031401 | 3/2013 |
| KR | 10-2014-0030873 | 3/2014 |
| KR | 20160032777 A | 3/2016 |

* cited by examiner

*Primary Examiner* — Monica D Harrison
(74) *Attorney, Agent, or Firm* — Innovation Counsel LLP

(57) ABSTRACT

A method of fabricating a wire grid polarizer includes sequentially forming a conductive layer, a guide layer, and a surface treatment protection layer on a substrate, patterning the surface treatment protection layer and the guide layer, forming a surface treatment film on side surfaces and upper surfaces of the first and second patterns, removing the first and second surface treatment protection patterns from the respective first and second patterns on which the surface treatment film is formed, to expose upper surfaces of the first and second guide patterns and providing a block copolymer of two monomers having mutually different etch rates into a space defined by the conductive layer and the first and second guide patterns, wherein a transfer layer which is hydrophobic to the block copolymer of two monomers is formed on the upper surfaces of the first and second guide patterns.

20 Claims, 10 Drawing Sheets

WIRE GRID POLARIZER AND METHOD OF FABRICATING THE SAME

CROSS-REFERENCE TO RELATED APPLICATION

This application claims priority to and the benefit of Korean Patent Application No. 10-2014-0182935, filed on Dec. 18, 2014, which is hereby incorporated by reference for all purposes as if fully set forth herein.

BACKGROUND

1. Field

Embodiments of the present inventive concept relates to a wire grid polarizer and a method of fabricating the same.

2. Discussion of the Background

Liquid crystal display devices are made up of a lot of optical layers including liquid crystals. This is because the liquid crystal display devices utilize polarized state of light.

Polarizers may play a significantly important role among others. Polarizers convert natural light into linearly polarized light.

Generally, film-type polarizers may be employed in order to produce linearly polarized light in the liquid crystal display devices. The film-type polarizers may have a laminated structure in which two tri-acetyl-cellulose films and a poly-vinyl-alcohol film are laminated. However, performance of the film-type polarizers may be degraded due to high humidity and temperature.

To overcome such drawback of the film-type polarizers, nanowire grid polarizer having a nanometer-sized metal pattern on a glass substrate are emerging as a substitute for the film-type polarizers.

The above information disclosed in this Background section is only for enhancement of understanding of the background of the inventive concept, and, therefore, it may contain information that does not form the prior art.

SUMMARY

Embodiments of the present inventive concept provide a method of fabricating a wire grid polarizer by a process in which alignment defects are reduced, a wire grid polarizer fabricated by the fabrication method, and a display device including the wire grid polarizer.

However, embodiments of the present inventive concept are not restricted to the one set forth herein. The other embodiments of the present inventive concept which are not mentioned herein will become more apparent to one of ordinary skilled in the art to which the present inventive concept pertains by referencing the detailed description of the present inventive concept given below.

Additional aspects will be set forth in the detailed description which follows, and, in part, will be apparent from the disclosure, or may be learned by practice of the inventive concept.

According to an exemplary embodiment of the present inventive concept, A method of fabricating a wire grid polarizer includes forming a conductive layer on a substrate, a guide layer on the conductive sequentially layer, and a surface treatment protection layer on the guide layer, patterning the surface treatment protection layer and the guide layer to form a first pattern in which a first surface treatment protection pattern is formed on a first guide pattern that partially exposes the conductive layer, and a second pattern in which a second surface treatment protection pattern is formed on a second guide pattern, forming a surface treatment film on side surfaces and upper surfaces of the first and second patterns, removing the first and second surface treatment protection patterns from the respective first and second patterns on which the surface treatment film is formed, to expose upper surfaces of the first and second guide patterns and providing a block copolymer of two monomers having mutually different etch rates into a space defined by the conductive layer and the first and second guide patterns, wherein a transfer layer which is hydrophobic to the block copolymer of two monomers is formed on the upper surfaces of the first and second guide patterns.

After providing a block copolymer of two monomers having mutually different etch rates into a space defined by the conductive layer and the first and second guide patterns may further include aligning the block copolymer of two monomers to form two monomer blocks, selectively removing one of the two monomer blocks and patterning the conductive layer using a residual monomer block and the first and second guide patterns as an etching mask to form a conductive wire pattern and a reflective film.

The two monomers may have mutually different etch rates and one of the two monomers is hydrophobic to the surface treatment film.

The surface treatment protection layer may be formed of a reverse crosslinkable material.

The surface treatment protection layer may be formed of a Cumarine-based material.

The surface treatment protection layer may be formed of water soluble polymer.

The surface treatment protection layer may be hydrophobic to both monomers of the block copolymer.

The transfer layer may be hydrophobic to both monomers of the block copolymer. Aligning the block copolymer may include heat annealing or solvent annealing the block copolymer.

Aligning the block copolymer may include swelling the block copolymer, wherein the transfer layer prevents the swelled block copolymer from overflowing. The upper surface of the second pattern may be wider than the upper surface of the first pattern. The method may further include reducing a width of the guide pattern. The reducing the width of the guide pattern may be a trimming process including a plasma treatment.

According to an exemplary embodiment of the present inventive concept, A method of fabricating a wire grid polarizer includes forming the conductive layer on the substrate, forming the guide layer on the conductive layer, forming a surface treatment protection layer on the guide layer, forming a hard mask layer on the surface treatment protection layer, and forming a sacrificial layer on the hard mask layer, forming a photoresist pattern on the sacrificial layer to expose a part of the sacrificial layer, etching the sacrificial layer to form a sacrificial pattern, and exposing a part of the hard mask layer, forming a mask material layer on the sacrificial pattern and the exposed hard mask layer, etching the mask material layer to form a mask pattern, and exposing the sacrificial pattern and a portion of the hard mask layer, etching the hard mask layer exposed beneath the mask pattern to form the hard mask pattern, etching the surface treatment protection layer and the guide layer exposed beneath the hard mask pattern to form first and second patterns including first and second guide patterns and first and second surface treatment protection patterns, removing the first and second surface treatment protection patterns from the respective first and second patterns to expose upper surfaces of the first and second guide patterns, and providing a block copolymer of two monomers having mutually different etch rates into a space defined by the conductive layer and the first and second guide patterns. The transfer layer which is hydrophobic to the block copolymer of two monomers may be formed on the upper surfaces of the first and second guide patterns.

According to an exemplary embodiment of the present invention, a wire grid polarizer include a substrate, multiple conductive wire patterns and reflective films protruded from the substrate and a first guide pattern formed on at least a part of the conductive wire patterns, and a second guide pattern formed on at least a part of the reflective films, wherein a surface treatment film is formed on at least a part of side surfaces of the first and second guide patterns, wherein a transfer layer is formed on at least a part of upper surfaces of the first and second guide patterns.

The wire grid polarizer may further include a monomer block on at least a part of the conductive wire patterns.

The transfer layer may include hydrophobic to the monomer block.

The upper surface of the second guide pattern may include wider than the upper surface of the first guide pattern.

According to an exemplary embodiment of the present inventive concept, a display device comprising: a protective film disposed on a wire grid polarizer, a gate line formed on the protective film and extending in a first direction, a data line insulated from the gate line and extending in a second direction, a thin film transistor electrically connected to the gate line and the data line, and a pixel electrode electrically connected to the thin film transistor, wherein the wire grid polarizer include a substrate, multiple conductive wire patterns and reflective films protruded from the substrate and a first guide pattern formed on at least a part of the conductive wire patterns, and a second guide pattern formed on at least a part of the reflective films, wherein a surface treatment film is formed on at least a part of side surfaces of the first and second guide patterns, wherein a transfer layer is formed on at least a part of upper surfaces of the first and second guide patterns.

The display device may further include a monomer block on at least a part of the conductive wire patterns.

The transfer layer may include hydrophobic to the monomer block.

Other detailed matters of embodiments are included in the detailed description and drawings.

Embodiments of the present inventive concept may at least exhibit effects described below.

According to the embodiments of the present inventive concept, there is provided a method of fabricating a wire grid polarizer with high yield rate, and a wire grid polarizer fabricated by the method.

The foregoing general description and the following detailed description are exemplary and explanatory and are intended to provide further explanation of the claimed subject matter.

However, effects of the present inventive concept are not restricted to the exemplary embodiments set forth herein and more diverse effects are included in this description.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

Figure 1:
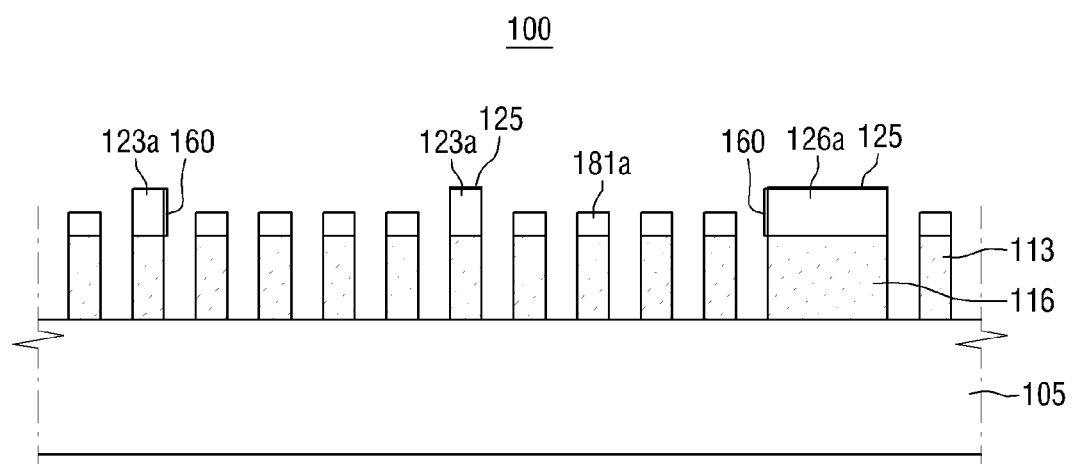
FIG. 1 is a cross-sectional view of a wire grid polarizer according to an exemplary embodiment of the present inventive concept.

DETAILED DESCRIPTION OF THE
ILLUSTRATED EMBODIMENTS

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Embodiments of the present inventive concept will now be explained with reference to the drawings.

FIG. 1 is a cross-sectional view of a wire grid polarizer according to an exemplary embodiment of the present inventive concept.

Referring to FIG. 1, a wire grid polarizer 100 may include multiple conductive wire patterns 113 and reflective films 116 protruded from a substrate 105 and arranged in parallel with each other.

The wire grid polarizer 100 may include the substrate 105, multiple conductive wire patterns 113 and reflective films 116 protruded from the substrate 105 and arranged in parallel with each other, first residual guide patterns 123a and second residual guide patterns 126a disposed on a part of the conductive wire patterns 113 and a part of the reflective films 116, respectively, and residual monomer blocks 181a disposed on the rest of the conductive wire patterns 113.

In the process of forming the conductive wire patterns 113 and the reflective film 116, if etching is performed at the state where first and second guide patterns (refer to 123 and 126 of FIG. 9) and monomer blocks (refer to 181 and 186 of FIG. 9) are not completely etched in order to avoid over-etch, the first residual guide patterns 123a and the second residual guide patterns 126a may be formed on a part of the conductive wire patterns 113 and a part of the reflective films 116, respectively. In addition, monomer blocks may remain on a part of the conductive wire patterns 113 to form the residual monomer blocks 181a.

In this case, the residual monomer blocks 181a may be recursively and regularly disposed. Specifically, multiple residual monomer blocks 181a may be arranged in the vicinity of each other, and may be recursively arranged with a single first residual guide pattern 123a disposed therebetween.

Transfer layers 125 with a hydrophobic polarity transferred thereto may be formed on a part of upper surfaces of the first and second residual guide patterns 123a and 126a formed during the process. That is, transfer layers 125 which are hydrophobic with respect to the monomer blocks 181a may remain on the upper surfaces of the first and second guide patterns 123a and 126a.

Furthermore, surface treatment films 160 which have a hydrophobic polarity with respect to any one of block copolymers may be disposed at a part of side surfaces of the first and second residual guide patterns 123a and 126a formed during the process.

As described above, the wire grid polarizer 100 may reflect the polarizing component (S-wave) parallel to a metal wire and transmit the polarizing component (P-wave) vertical to the metal wire in a case where the cycle of arranging the metal wire is shorter than the wavelength of the electromagnetic wave being applied.

Using this phenomenon, a planar polarizer having superior polarizing efficiency, high transmittance and wide view angle may be fabricated. Differently from a linear polarizer, the conductive wire grid polarizer 100 may use metal and thus have extremely high reflectivity, and therefore, the polarizer 100 may reflect the light from a light source and may recycle all the light to be a single polarized light.

That is, the reflected light passes through various films is reflected again by a reflector and converted to P-polarized wave and S-polarized wave and then emitted to an outer surface, and the recycled light may infinitely repeat this process to achieve improved optical efficiency.

A method of fabricating the above-described wire grid polarizer will hereinafter be explained.

FIG. 2 to FIG. 9 are cross-sectional views of the wire grid polarizer illustrating each fabrication process according to the embodiment of the present inventive concept.

Figure 2:
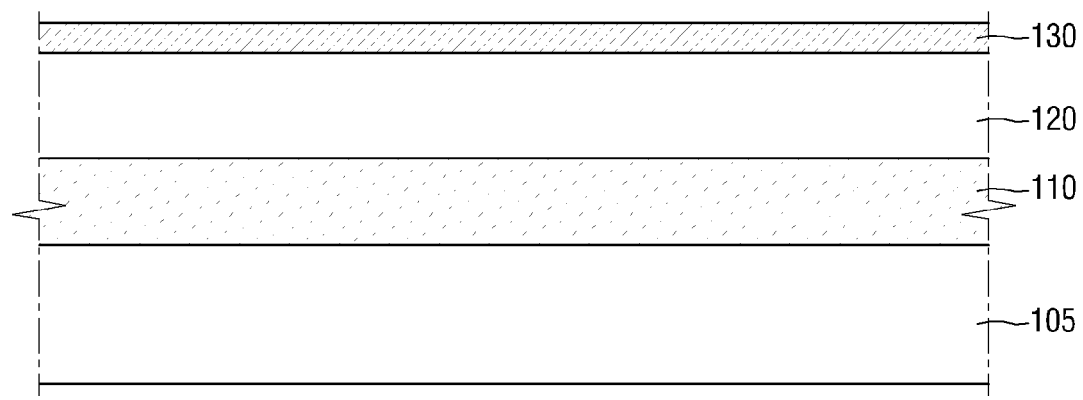
FIGS. 2, 3, 4, 5, 6, 7, 8 and 9 are cross-sectional views of the wire grid polarizer illustrating each fabrication process according to an exemplary embodiment of the present inventive concept.

Referring to FIG. 2, a conductive layer 110 is formed on the substrate 105.

The substrate 100 may be formed of any material that can transmit visible light, and the material can be selected with consideration of use or process. For example, such material may be various kinds of polymers such as glass, quartz, acryl, triacetylcellulose (TAC), cyclic olefin copolymer (COC), cyclic olefin polymer (COP), polycarbonate (PC), polyethylene naphthalate (PET), polyimide (PI), polyethylene naphthalate (PEN), polyether sulfone (PES), and polyarylate (PAR), however, the material is not limited thereto. The substrate 105 may be formed of an optical film base material having flexibility of a predetermined level.

The conductive layer 110 may be formed of any conductive material without limitations. In an exemplary embodiment, the conductive layer 110 may be formed of a metal material, and more specifically, the conductive layer 110 may be formed of, but not limited to, a single metal selected from a group consisting of aluminum (Al), chrome (Cr), silver (Ag), copper (Cu), nickel (Ni), titanium (Ti), cobalt (Co) and molybdenum (Mo), or an alloy thereof In some cases, the conductive layer 110 may include two or more layers. For example, a first conductive layer (not shown) may be formed of aluminum, and a second conductive layer (not shown) may be formed of titanium or molybdenum, however, the first and second conductive layers are not limited thereto. If the first conductive layer (not shown) is formed of aluminum, a hillock may generated due to a high process temperature in the subsequent process after forming the aluminum, causing an uneven upper surface of the first conductive layer and thus causing degradation of optical characteristics of products. Accordingly, the second conductive layer (not shown) formed of titanium or molybdenum may be formed on the first conductive layer (not shown), thereby preventing a hillock which might otherwise occur during processes.

A method of forming the conductive layer 110 may be a typical sputtering method, a chemical vapor deposition (CVD), an evaporation method and the like, however, the method is not limited thereto.

Subsequently, a guide layer 120 is formed on the conductive layer 110.

The guide layer 120 may be a soft pattern layer formed of a photoresist material, an organic material or the like, or a hard material layer formed of metal, an inorganic material or the like. Herein, the guide layer 120 is described as a photoresist, however, the guide layer 120 is not limited thereto.

Subsequently, a surface treatment protection layer 130 is formed on the guide layer 120.

The surface treatment protection layer 130 may be formed of, but not limited to, a reverse crosslinkable material or water soluble polymer. For example, Coumarine-based material may be used as the reverse crosslinkable material.

Figure 3:
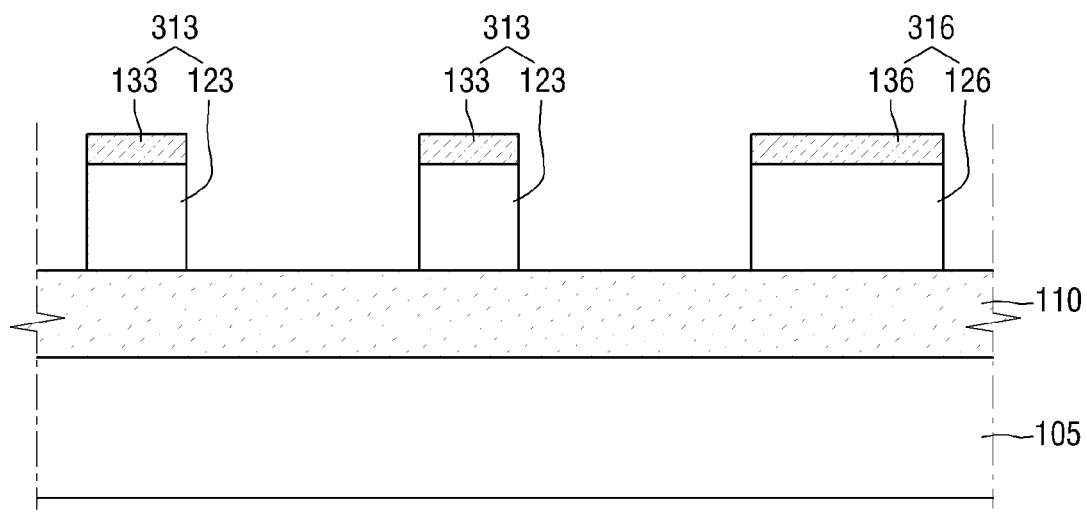

Referring to FIG. 3, the thus-formed guide layer 120 and surface treatment protection layer 130 are exposed and developed using a mask or the like according to a pattern so as to form a first pattern 313 having a first guide pattern 123 and a first surface treatment protection pattern 133, and a second pattern 316 having a second guide pattern 126 and a second surface treatment protection pattern 136. The second pattern 316 may have an upper surface wider than the upper surface of the first pattern 313.

In this case, a process of forming the first pattern 313 and the second pattern 316 is not limited to a photoresist process, and various patterning techniques may be used. As described above, the first pattern 313 and the second pattern 316 may be formed to expose a part of the conductive layer 110.

Figure 4:
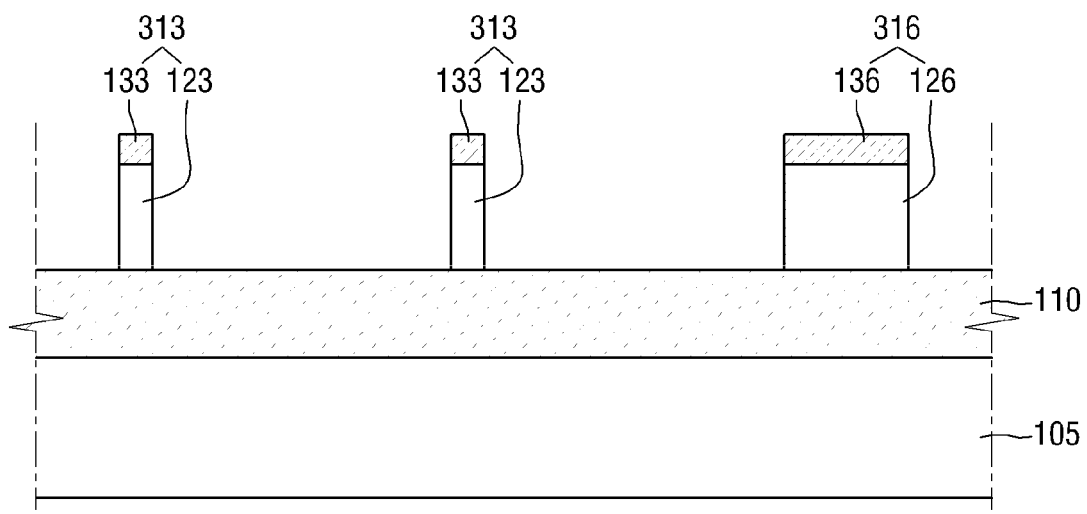

Referring to FIG. 4, a process of reducing the width of the first pattern 313 and the width of the second pattern 316 is performed. In this case, the process of reducing the width of the first pattern 313 and the width of the second pattern 316 may be a trimming process. Through this trimming process, the width of the first pattern 313 and the width of the second pattern 316 may become similar to the width of the monomer blocks 181 and 186 of the block copolymer 180 and a light non-displaying region of a display device, respectively.

The trimming process may be implemented through, but not limited to, oxygen ($O_2$) plasma treatment, and any process that can reduce the width of the first pattern 313 and the width of the second pattern 316 may be used. In a specific example, $SF_6$ or CF-based gas may be added for the oxygen plasma treatment, and as an example of the CF-based gas, there are $C_4F_8$, $CHF_3$, $CH_2F_2$, $C_4F_8$, $CF_4$, $C_2F_6$ and the like, however, the CF-based gas is not limited thereto.

In this case, the trimming process should form the height of the first pattern 313 and the height of the second pattern 316 into a predetermined height in consideration of the alignment of the block copolymer 180 or the like which will be formed later. This is because parallel defects may occur in that the block copolymer 180 may swell due to energy such as heat provided during an alignment process and may then be connected to an adjacent block copolymer 180.

However, in the present embodiment, the first pattern 313 and the second pattern 316 having a predetermined height may be formed of the first and second guide patterns 123 and 126 using a photoresist material, and the first and second surface treatment protection patterns 133 and 136 disposed on the first and second guide patterns 123 and 126, respectively. Thus, consumption of the photoresist material may be reduced by the first and second guide patterns 123 and 126 during the trimming process. As a result, consumption of the expensive photoresist material may be reduced to thus reduce manufacturing cost.

As described above, the trimming process is employed as an example of a process for forming the widths of the first pattern 313 and the second pattern 316 such that the width of the first pattern 313 become similar to the widths of the monomer blocks 181 and 186 of the block copolymer 180 which will be aligned later, however, the process is not limited to the trimming process.

Furthermore, the second pattern 316 may be formed to have a width larger than that of the first pattern 313, and thus, the conductive layer 110 disposed in the region overlapping the second pattern 316 is not patterned to have the widths of the monomer blocks 181 and 186 of the block copolymer 180 and serves as a reflective film. The second pattern 316 may be formed in a non-display region of a display device. Thus, light incident on the non-display region may be reflected to achieve luminance enhancement. In this case, the second pattern 316 may be patterned to have a width corresponding to the non-display region after the trimming process. The trimming process may not require if the first pattern 313 is initially formed to have a similar width of the monomer blocks 181 and 186 of the block copolymer 180.

Figure 5:
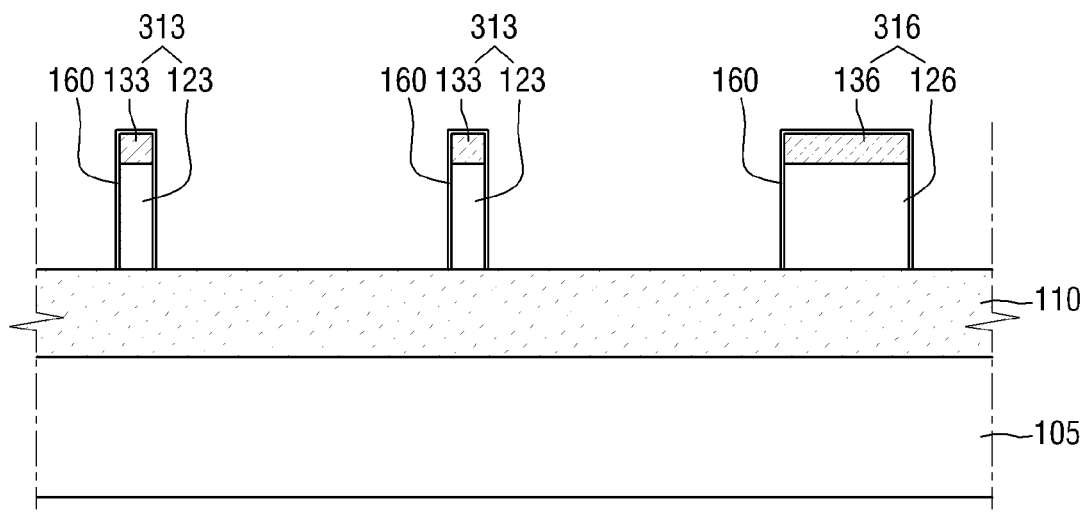

Referring to FIG. 5, a surface treatment film 160 is formed on the substrate on which the first pattern 313 and the second pattern 316 are formed. That is, the surface treatment film 160 may be formed along a side surface of the first guide pattern 123 and a side surface and an upper surface of the first surface treatment protection pattern 133 in the first pattern 313. In addition, the surface treatment film 160 may be formed along a side surface of the second guide pattern 126 and a side surface and an upper surface of the second surface treatment protection pattern 136 in the second pattern 316.

The surface treatment film 160 may be a fluorinated hydrophobic film, however, the film 160 is not limited thereto. As the surface treatment film 160 contains fluorine, carbon (C)-fluorine (F) bond may be formed between the surface treatment film 160 and the first and second pattern 313 and 316. However, as the metal in the conductive layer 110 does not contain carbon, the conductive layer 110 may not react to fluorine (F). Accordingly, the surface treatment film 160 may not be formed on the surface of the conductive layer 110 exposed by the trimming process.

Furthermore, the surface treatment film 160 may be formed of, but not limited to, a monolayer for example. A method of forming the surface treatment film 160 may be an atomic layer deposition (ALD) or the like for the formation of the monolayer, however, the method is not limited thereto, and other existing methods for forming a thin film may also be used. In one example, a chemical ALD may be used to form the surface treatment film 160 in the same manner at side surfaces of the first and second patterns 313 and 316.

In this case, the surface treatment film 160 may be a hydrophobic film with respect to either the monomer block 181 or 186 of the block copolymer 180 which will be arranged later.

Figure 6:
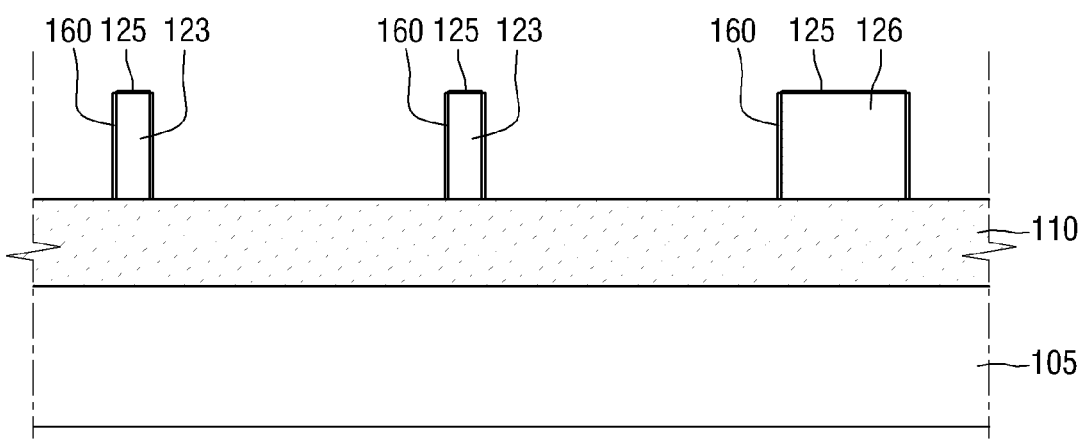

Referring to FIG. 6, the first and second surface treatment protection patterns 133 and 136 formed on the first and second guide patterns 123 and 126, respectively, are removed in the first and second patterns 313, 316. The first and second surface treatment protection patterns 133 and 136 are formed of a reverse crosslinkable material, and therefore, can be reverse crosslinked when heat, light or the like is provided to the first and second surface treatment protection patterns 133 and 136. Then, the reverse crosslinked first and second surface treatment protection patterns 133 and 136 may be removed by a lift-off process from the first and second guide patterns 123 and 126.

Alternatively, the first and second surface treatment protection patterns 133 and 136 may be formed of water soluble polymer, and a developer or the like may be provided to the first and second surface treatment protection patterns 133 and 136 so as to remove the first and second surface treatment protection patterns 133 and 136 from the first and second guide patterns 123 and 126. In this case, the developer for removing the first and second surface treatment protection patterns 133 and 136 may be different from the developer used in the guide layer 120 formed of a photoresist material.

In this case, the polarity of the first and second surface treatment protection patterns 133 and 136 may be transferred to the region where the first and second surface treatment protection patterns 133 and 136 and the first and second guide patterns 123 and 126 contact each other, that is, the upper surfaces of the first and second guide patterns 123 and 126 contacting the lower surfaces of the first and second surface treatment protection patterns 133 and 136, so that the region may have a hydrophilic or hydrophobic polarity with respect to a certain material. That is, the transfer layer 125 having a predetermined polarity may be formed on the upper surfaces of the first and second guide patterns 123 and 126.

The transfer layer 125 formed on the upper surfaces of the first and second guide patterns 123 and 126 may have a hydrophobic polarity with respect to the monomer blocks 181 and 186 of the block copolymer 180 in the process of depositing the block copolymer 180 which will be performed later. This will be explained later with reference to the process of depositing the block copolymer 180.

As discussed above, the first and second surface treatment protection patterns 133 and 136 may be removed from the first and second guide patterns 123 and 126 so as to expose the upper surfaces of the first and second guide patterns 123 and 126 and form the transfer layer 125 having a predetermined polarity on the upper surfaces of the first and second guide patterns 123 and 126. The transfer layer 125 formed on the upper surfaces of the first and second guide patterns 123 and 126 may have a hydrophobic polarity with respect to both the monomer blocks 181 and 186 of the block copolymer 180.

Thus, the surface treatment film 160 having hydrophobic properties with respect to either the monomer block 181 or 186 of the block copolymer 180 may be formed at the side surfaces of the first and second guide patterns 123 and 126, and the transfer layer 125 having hydrophobic properties with respect to both the monomer blocks 181 and 186 of the block copolymer 180 may be formed on the upper surfaces of the first and second guide patterns 123 and 126.

Figure 7:
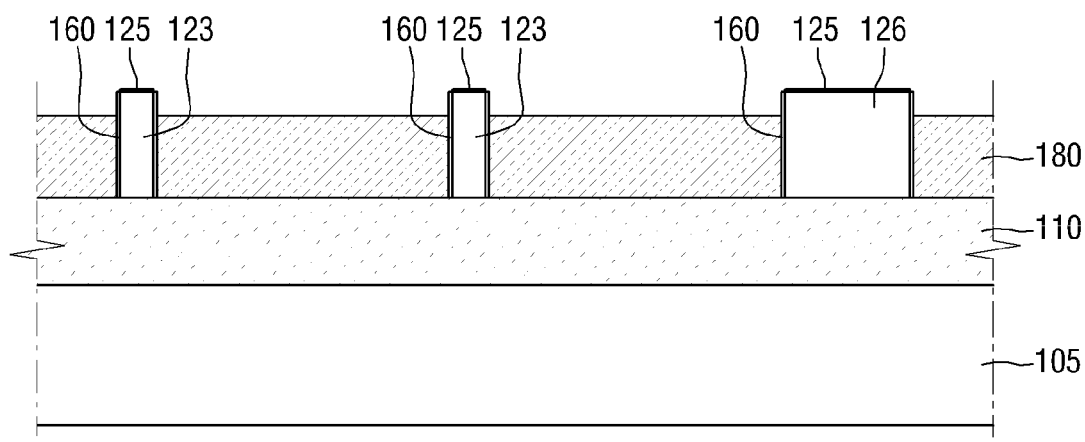

Referring to FIG. 7, the block copolymer 180 is provided onto the substrate where the first and second surface treatment protection patterns 133 and 136 are removed to leave the first and second guide patterns 123 and 126.

Specifically, the block copolymer 180 having two monomers with different etch rates with respect to a predetermined etching agent is provided in the space defined by the conductive layer 110 and the first and second guide patterns 123 and 126. More specifically, the block copolymer 180 having two monomers may be provided between two first guide patterns 123 and between the first guide pattern 123 and the second guide pattern 126.

The block copolymer 180 may be, for example, a polystyrene (PS)-polymethyl methacrylate (PMMA) block copolymer, however, the block copolymer 180 is not limited thereto. The block copolymer 180 may be provided in the space defined by the conductive layer 110 and the first and second guide patterns 123 and 126 by spin coating or the like.

The monomers contained in the block copolymer 180 may be formed of materials which are different not only in an etch rate but also in hydrophilic and hydrophobic properties. In this case, although not shown in the drawings, a neutral layer may be formed on a bottom of the space defined by the conductive layer 110 and the first and second guide patterns 123 and 126 to enable the block copolymer 180 to be effectively disposed.

Furthermore, the side surfaces of the first and second guide patterns 123 and 126 may have hydrophobic properties with respect to either monomer of the block copolymer 180, and therefore, the surface of the conductive layer 110 exposed to the first and second guide patterns 123 and 126 may be a relative neutral layer or may have a polarity similar to hydrophilic properties. Accordingly, the block copolymer 180 may be easily disposed in the space defined by the conductive layer 110 and the first and second guide patterns 123 and 126.

In this case, the transfer layer 125 having hydrophobic properties with respect to the monomers of the block copolymer 180 may be formed on the upper surfaces of the first and second guide patterns 123 and 126, and therefore, the block copolymer 180 may not be disposed on the upper surfaces of the first and second guide patterns 123 and 126.

For example, in cases where the transfer layer 125 having hydrophobic properties is not formed on the upper surfaces of the first and second guide patterns 123 and 126, if the block copolymer 180 is deposited onto the substrate, the water droplet-shaped dewet block copolymer 180 may be formed on the second guide pattern 126 since the upper surface of the second guide pattern 126 is relatively wider than the upper surface of the first guide pattern 123. The water droplet-shaped dewet block copolymer may cause a smear in a phase separation process which will be performed later. This will be explained in detail later.

As discussed above, the transfer layer 125 is formed on the upper surfaces of the first and second guide patterns 123 and 126, and the surface treatment film 160 is formed at the side surfaces of the first and second guide patterns 123 and 126 so as to minimize the dewet block copolymer, and the exposed surface of the conductive layer 110 is formed to have a neutral layer or a layer having properties similar to hydrophilic properties so as to allow for ease of deposition of the block copolymer 180.

Figure 8:
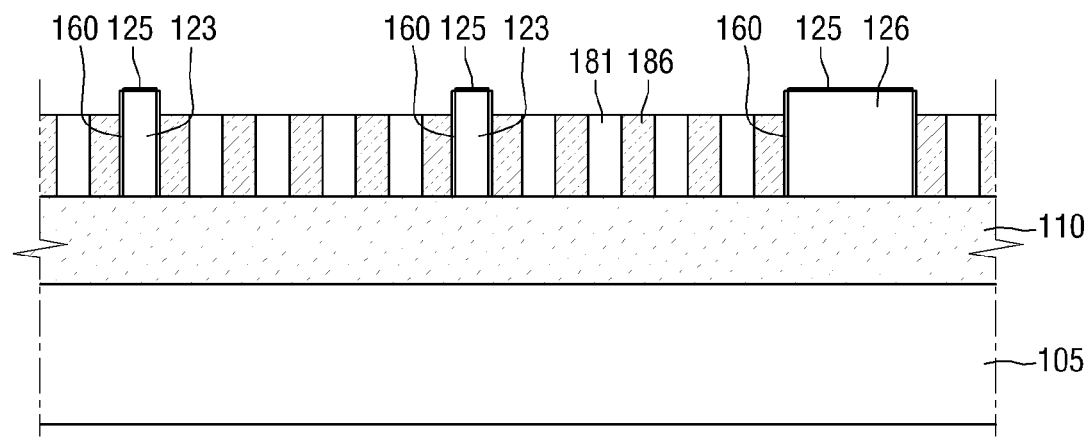

Referring to FIG. 8, the block copolymer 180 having the two monomers is phase separated to form the two monomer blocks 181 and 186.

Each of the monomer blocks 181 and 186 obtained by phase separation of the block copolymer 180 may be formed of materials which are different not only in an etch rate but also in hydrophilic and hydrophobic properties. In this case, the surface treatment film 160 disposed at the side surface of the second guide pattern 126 is hydrophilic to the monomer block 186, and therefore, the monomer block 186 having a relatively hydrophilic polarity than the monomer block 181 may be arranged in the vicinity of the surface treatment film 160. Thus, the block copolymer 180 may be effectively aligned due to the surface treatment film 160.

Herein, the monomer block having a hydrophobic polarity to the surface treatment film 160 is referred to as the first monomer block 181, and the monomer block having a hydrophilic polarity to the surface treatment film 160 is referred to as the second monomer block 186.

In detail, the block copolymer 180 may be, but not limited to, a random copolymer of monomers. The random copolymer may be a crosslinkable random copolymer. The side surfaces of the first and second guide patterns 123 and 126 may have selectivity, i.e., hydrophilic or hydrophobic properties, to either the monomer block 181 or 186, thus aligning the block copolymer 180 in a more effective way.

In the meantime, the block copolymer 180 may not be formed on the upper surface of the second guide pattern 126 because the upper surface may have a hydrophobic polarity to each monomer. In cases where the dewet block copolymer is disposed on the upper surface of the second guide pattern 126 as described above, the dewet block copolymer may be dripped onto an adjacent block copolymer from the upper surface of the second guide pattern 126 due to the fluidity of the dewet block copolymer during the phase separation process for aligning the block copolymer 180.

Thus, defects such as a coating smear may occur in the block copolymer adjacent to the second guide pattern 126 due to the dripped block copolymer. That is, the monomer blocks 181 and 186 may not be formed into a predetermined pattern due to the dripped block copolymer. Accordingly, the conductive wire pattern 113 may have an unwanted pattern in the processes which will be performed later.

However, the transfer layer 125 having a hydrophobic polarity to the block copolymer may be formed on the upper surface of the second guide pattern 126, and thus the dewet block copolymer may not be disposed on the upper surface of the second guide pattern 126.

As described above, the surface treatment film 160 and the transfer layer 125 are formed on the side surfaces and upper surfaces of the first and second guide patterns 123 and 126, respectively, so as to allow for ease of alignment of the block copolymer 180 and prevent defects such as a coating smear caused due to the dewet block copolymer.

Meanwhile, a method of aligning the block copolymer 180 may be thermal annealing or solvent annealing, however, the method is not limited thereto. Generally, solvent annealing which anneals in a chamber that contains an evaporated solvent has advantages of shortened alignment time as compared with the thermal annealing which applies heat, however, such thermal annealing or solvent annealing can be selected in consideration of a whole process integration.

The annealing process may form the height of the first and second guide patterns 123 and 126 to be higher than that of the block copolymer 180. For example, the solvent annealing process may cause swelling of the block copolymer 180 when the evaporated solvent permeates into the block copolymer 180. The swelling may cause defects of connecting the block copolymer to an adjacent block copolymer on the first and second guide patterns 123 and 126.

However, in the present embodiment, the transfer layer 125 having a hydrophobic polarity to both monomer blocks 181 and 186 of the block copolymer 180 is disposed on the upper surfaces of the first and second guide patterns 123 and 126, therefore, it is expected that parallel defects of the block copolymer 180 caused by swelling can be prevented. Thus, the transfer layer 125 may prevent the adjacent block copolymer from being connected to the adjacent block copolymer 180 even when the block copolymer 180 is swelled.

As described above, the transfer layer 125 on the upper surfaces of the first and second guide patterns 123 and 126 may prevent defects in that the block copolymer 180 overflows to be connected to the adjacent block copolymer 180, and may prevent a formation of dewet block copolymer on the first guide pattern 123 and the second guide pattern 126 so as to thereby allow the block copolymer 180 to be smoothly aligned.

Figure 9:
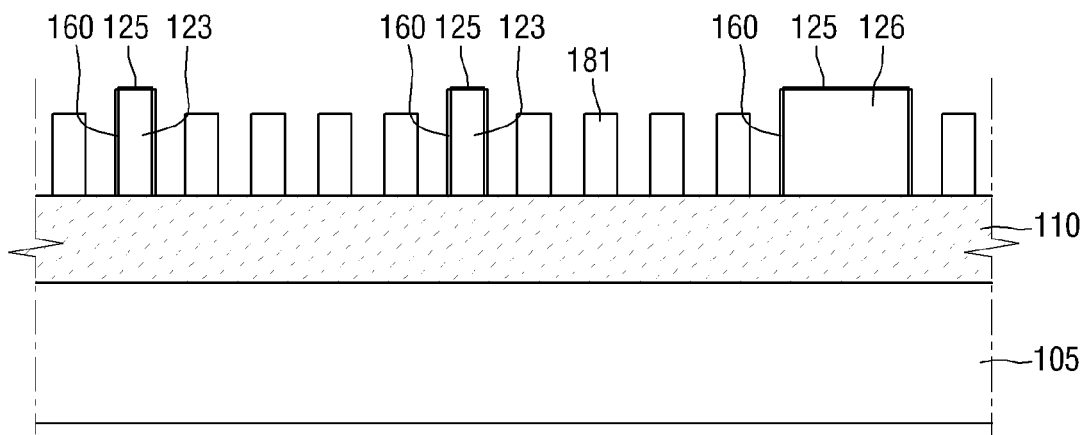

Referring to FIG. 9, the monomer block 186 of the two monomer blocks 181 and 186 is selectively removed. Specifically, the second monomer block 186 which has an etch rate relatively higher than that of the first monomer block 181 to an etching agent may be selectively removed.

To selectively remove the monomer block 186 having a relatively higher etch rate, a typical etching process, for example, a dry etching process can be used, however, the etching process is not limited thereto. Gases to be used in the etching process may one or more selected from a group consisting of $O_2$, fluorinated carbon gas and HF, however, the gases are not limited thereto. The fluorinated carbon gas may be one or more selected from a group consisting of $C_4F_8$, $CHF_3$, $CH_2F_2$, $C_4F_8$, $CF_4$ and $C_2F_6$, however, the fluorinated carbon gas is not limited thereto.

In this case, the surface treatment film 160 and the transfer layer 125 which are formed on the side surfaces and upper surfaces of the first and second guide patterns 123 and 126, respectively, may remain or may be removed during an etching process.

Referring back to FIG. 1, the conductive layer 110 may be patterned using the residual first monomer block 181 and first and second guide patterns 123 and 126 as an etching mask so as to thereby form the conductive wire pattern 113 and the reflective film 116. Thus, multiple conductive wire patterns 113 may be protruded from the substrate 105 and arranged in parallel with each other.

In the process of forming the conductive wire patterns 113 by etching the conductive layer 110, the first and second guide patterns 123 and 126 and the first monomer blocks 181 are not completely removed to avoid over-etch, the first and second residual guide patterns 123a and 126a and the residual monomer block 181a may be formed on the conductive wire patterns 113. In addition, a part of the surface treatment layer 160 and a part of the transfer layer 125 may remain while etching the conductive layer 110.

In this case, the residual monomer block 181 may be recursively and regularly disposed. Specifically, multiple residual monomer blocks 181 may be arranged in the vicinity of each other, and may be recursively arranged with a single first guide pattern 123 or second guide pattern 126 disposed therebetween.

As described above, the surface treatment film 160 is formed at the side surfaces of the first and second guide patterns 123 and 126, and the transfer layer 125 is formed on the upper surfaces of the first and second guide patterns 123 and 126, thereby preventing a coating smear of the block copolymer, allowing for a smooth alignment of the block copolymer, and preventing parallel defects. Furthermore, the first and second surface treatment protection patterns 133 and 136 are formed on the first and second guide patterns 123 and 126 which use a photoresist material, thereby reducing consumption of the expensive photoresist material and achieving cost reduction.

FIG. 10 to FIG. 16 are cross-sectional views of a method of fabricating the wire grid polarizer according to another embodiment of the present inventive concept. The present embodiment will be explained by citing FIG. 1 to FIG. 9, and identical elements will be briefly explained or omitted to avoid duplicated explanation.

In the present embodiment, processes same as those of FIG. 5 to FIG. 9 may be carried out to fabricate a wire grid polarizer. In addition, a process for reducing the width of a pattern such as the trimming process explained with reference to FIG. 1 to FIG. 4 may be performed in another way so as to form the first and second patterns 313 and 316 having widths similar to those of the monomer blocks 181 and 186 of the block copolymer.

Figure 10:
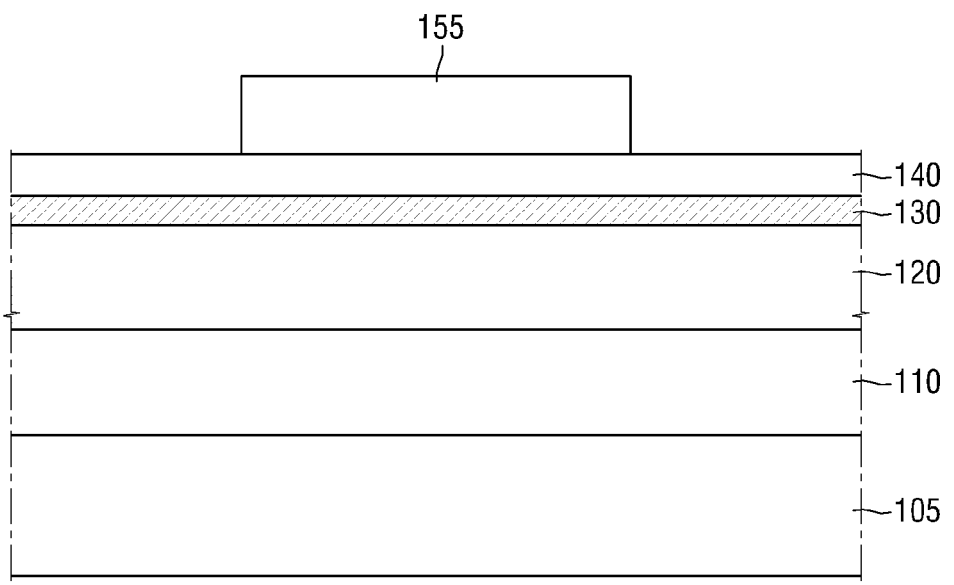
FIGS. 10, 11, 12, 13, 14, 15 and 16 are cross-sectional views of a method of fabricating the wire grid polarizer according to another exemplary embodiment of the present inventive concept.

Referring to FIG. 10, the conductive layer 110 is formed on the substrate 105, and the guide layer 120 is formed on the conductive layer 110.

The guide layer 120 may be a soft pattern layer formed of a photoresist material, an organic material or the like, or a hard material layer formed of metal, an inorganic material or the like. For example, the guide layer 120 may be formed of, but not limited to, silicon nitride (SiNx).

Subsequently, the surface treatment protection layer 130 is formed on the guide layer 120. The surface treatment protection layer 130 may be formed of, but not limited to, a reverse crosslinkable material or water soluble polymer. For example, Coumarine-based material may be used as the reverse crosslinkable material.

A hard mask layer 140 is formed on the surface treatment protection layer 130.

The hard mask layer 140 may be formed of a material having high etch selectivity to the guide layer 120, such as metal, an inorganic material, etc. For example, in the present embodiment, any one metal material selected from chrome (Cr), molybdenum (Mo) and a mixture thereof may be used, however, the present embodiment is not limited thereto.

Then, a sacrificial layer (not shown) is formed on the hard mask layer 140. The sacrificial layer (not shown) may be a soft pattern layer formed of an organic material or the like. The sacrificial layer may be formed of a silicon-based insulating material which contains $SiO_2$, for example, however, the sacrificial layer is not limited thereto.

Subsequently, the photoresist pattern (not shown) may be formed on the sacrificial layer. In one example, the photoresist pattern may be formed by coating a photoresist layer, and exposing and developing the photoresist layer using a mask or the like according to a pattern, however, the photoresist patterning is not limited thereto and various patterning techniques may be employed. The photoresist pattern is thus formed to expose a part of the sacrificial layer.

Referring to FIG. 10, the sacrificial layer is etched using the photoresist pattern as an etching mask so as to thereby form a sacrificial pattern 155. The sacrificial pattern 155 may be formed by wet etching or dry etching selected according to the material used for the sacrificial layer.

Figure 11:
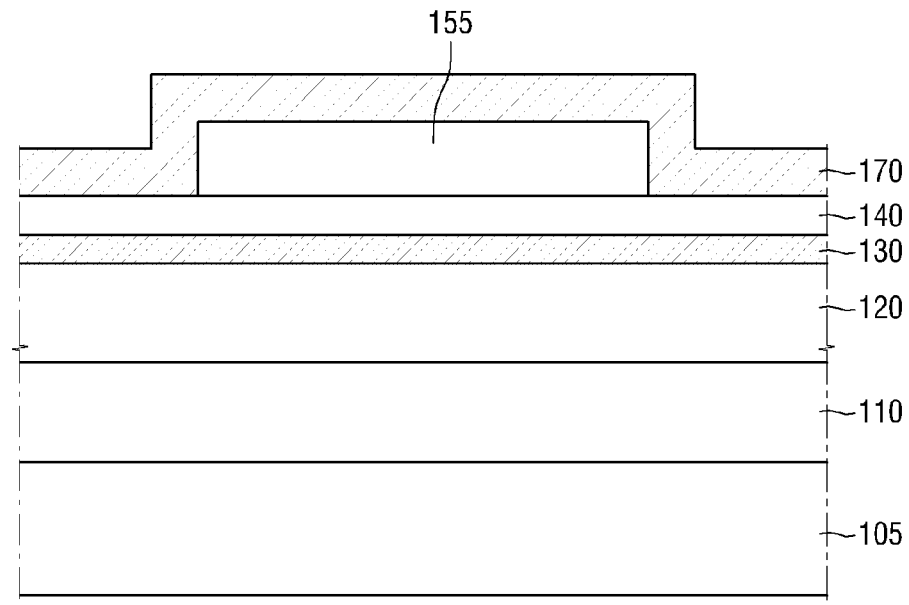

Referring to FIG. 11, a mask material layer 170 is formed on the substrate on which the sacrificial pattern 155 is formed. The mask material layer 170 may be formed of an inorganic material, an organic material, etc.

Figure 12:
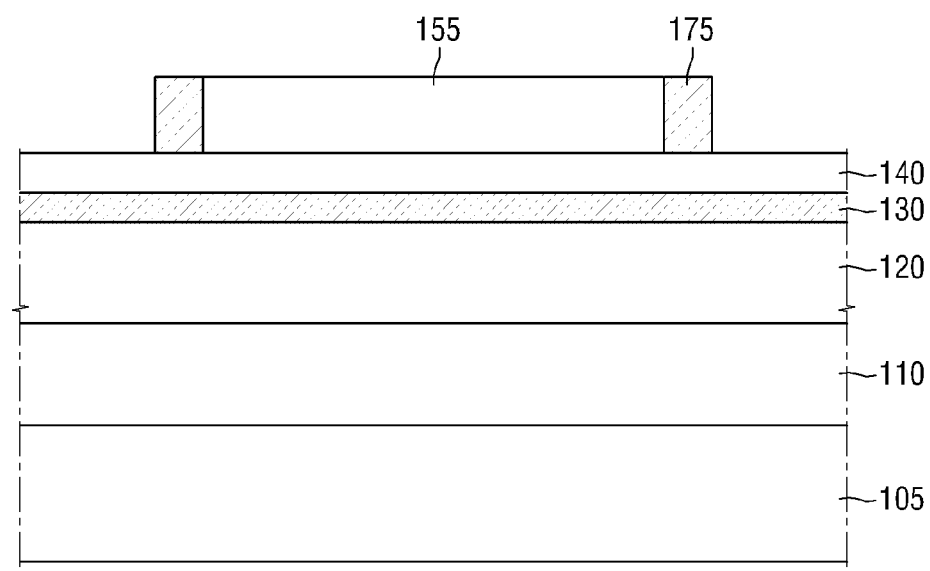

Referring to FIG. 12, the mask material layer 170 is etch-backed to form a mask pattern 175 without using a protection layer on the mask material layer 170. Through this process, the widths of the first and second guide patterns 123 and 126 formed as illustrated in FIG. 1 to FIG. 9 may become similar to the widths of the monomer blocks 181 and 186 of the block copolymer 180 which will be aligned later. The width of the mask pattern 175 may be determined according to the thickness of the sacrificial pattern 155. Thus, the thickness of the sacrificial pattern 155 may be determined according to the widths of the monomer blocks 181 and 186 of the block copolymer 180.

The mask material layer 170 may be anisotropically etched without using a protection layer on the mask material layer 170 so that the horizontal part of the mask material layer 170 is etched and the vertical part of the mask layer 170 remains, thereby forming the mask pattern 175.

While the horizontal part of the mask material layer 170 is being etched to form the mask pattern 175, a part of the hard mask layer 140 and an upper surface of the sacrificial pattern 155 may be exposed.

Figure 13:
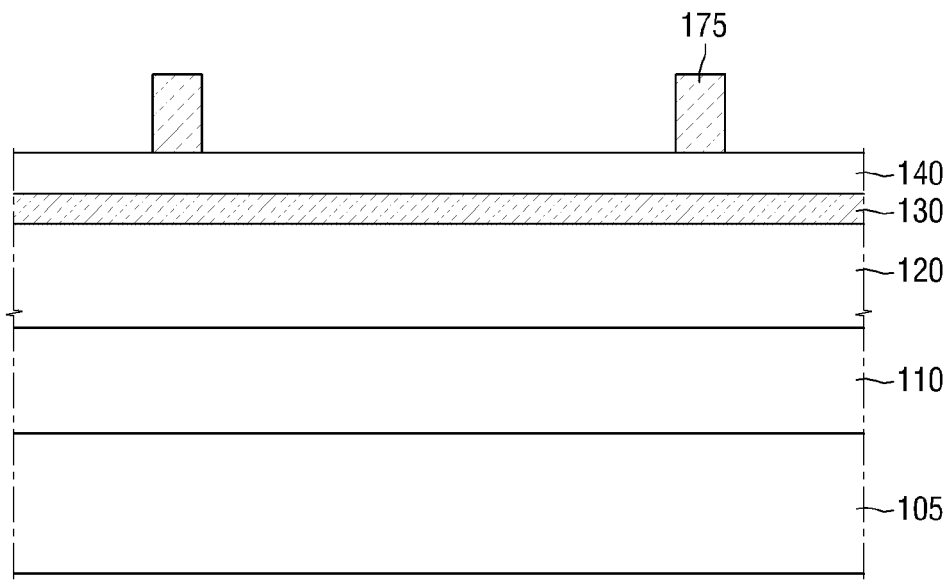

Referring to FIG. 13, the sacrificial pattern 155 is removed. By removing the sacrificial pattern 155, a part of the hard mask layer 140 beneath the sacrificial pattern 155 can be exposed.

Thus, mask patterns 175 may be disposed at a predetermined spacing on the hard mask layer 140.

Figure 14:
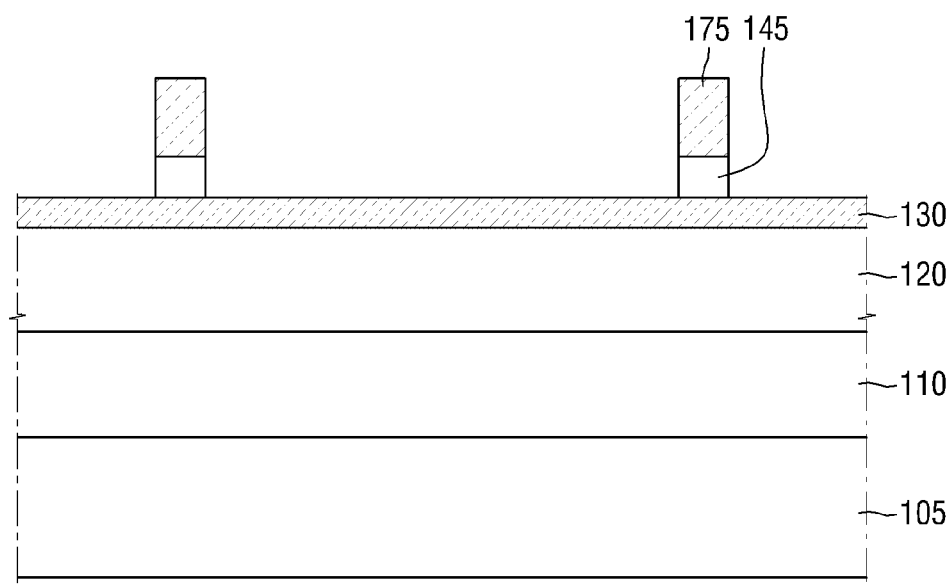

Referring to FIG. 14, the hard mask layer 140 is etched using the mask pattern 175 as a mask so as to thereby form a hard mask pattern 145. The hard mask layer 140 may be formed of metal which exhibits low etch rate in the future etching process of the first guide patterns 123-1 and second guide patterns and which thus can remain unetched after etching the first guide pattern 123-1. For example, the hard mask layer 140 may be formed of metal such as molybdenum (Mo), chrome (Cr) or the like. The hard mask layer 140 may be etched by wet etching or the like.

The hard mask pattern 145 may be thus formed to expose a part of the surface treatment protection layer 130 disposed beneath the hard mask layer 140. In this case, a part of the mask pattern 175 may remain on the hard mask pattern 145.

Figure 15:
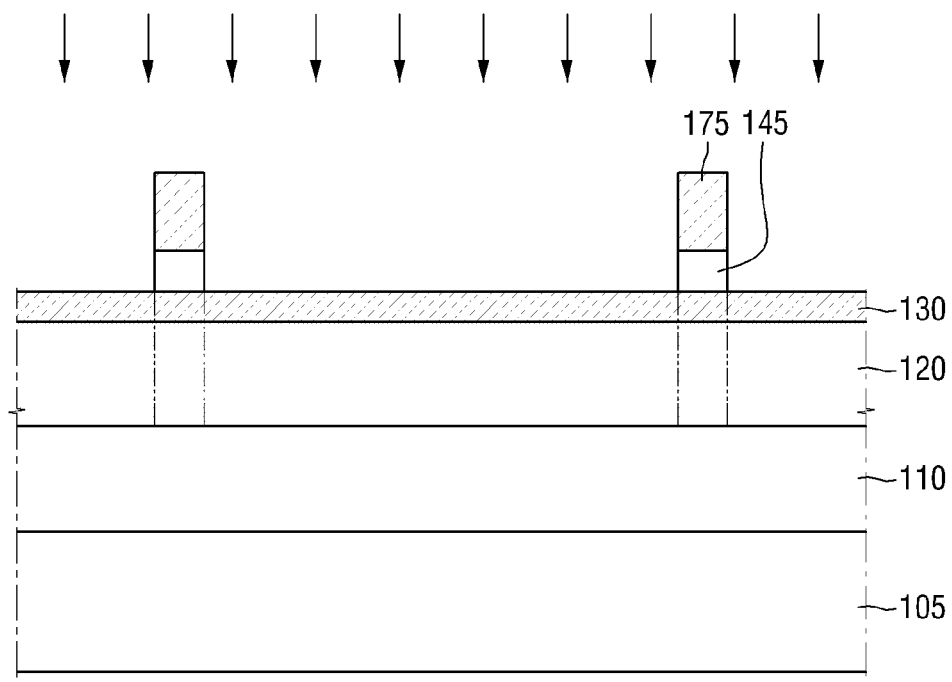

Referring to FIG. 15, the exposed part of the surface treatment protection layer 130 is etched using the hard mask pattern 145 and the residual mask pattern 175 as a mask, thereby etching the surface treatment protection layer 130 and the guide layer 120. The guide layer 120 may be dry etched using plasma etching process or reactive ion etching (RIE) process.

Figure 16:
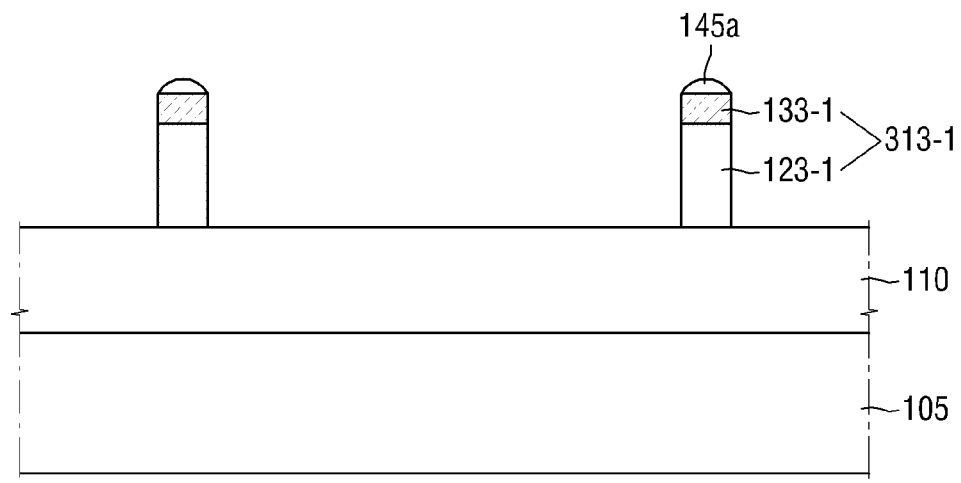

Referring to FIG. 16, a first pattern 313-1 may include a surface treatment protection pattern 133-1 formed by etching the surface treatment protection layer 130, and the guide pattern 123-1 formed by etching the guide layer 120. Although a second pattern is omitted in the drawing, the second pattern including the second surface treatment protection pattern is regarded as being formed on the second guide pattern near the first pattern 313-1 by citing FIG. 1 to FIG. 9.

The mask pattern 175 may be consumed during the etching process of the surface treatment protection layer 130 and the guide layer 120, however, a part of the hard mask pattern 145 remains because the etching selectivity of the hard mask patterns to the surface treatment protection layer 130 and the guide layer 120 is good enough, thus forming a residual hard mask pattern 145*a*. To remove the residual hard mask pattern 145*a*, wet etching may be further carried out.

Alternatively, metal which can be easily etched by the etching process of the first surface treatment protection pattern 133-1 and the second surface treatment protection pattern and the first guide pattern 123-1 and the second guide pattern may be employed. In this case, if metal having high etch rate is employed, the hard mask pattern 145 may be removed by the etching process of the first surface treatment protection pattern 133-1 and the second surface treatment protection patterns and the first guide pattern 123-1 and the second guide pattern, thus eliminating the necessity of the process for removing the hard mask pattern 145 and simplifying the processes.

Thus, the first pattern 313-1 and the second pattern in which the first surface treatment protection pattern 133-1 and the second surface treatment protection pattern are formed on the first guide pattern 123-1 and the second guide pattern, respectively, may be obtained.

Similarly to FIG. 1 to FIG. 9, the surface treatment layer 160 is formed on the first and second patterns 313-1 and 316-1, and the surface treatment protection patterns 133-1 and 136-1 are removed to form the transfer layer 125 on the first and second guide patterns 123-1 and 126-1, thus obtaining the wire grid polarizer 100 in which an alignment of monomer block is easily performed.

Figure 17:
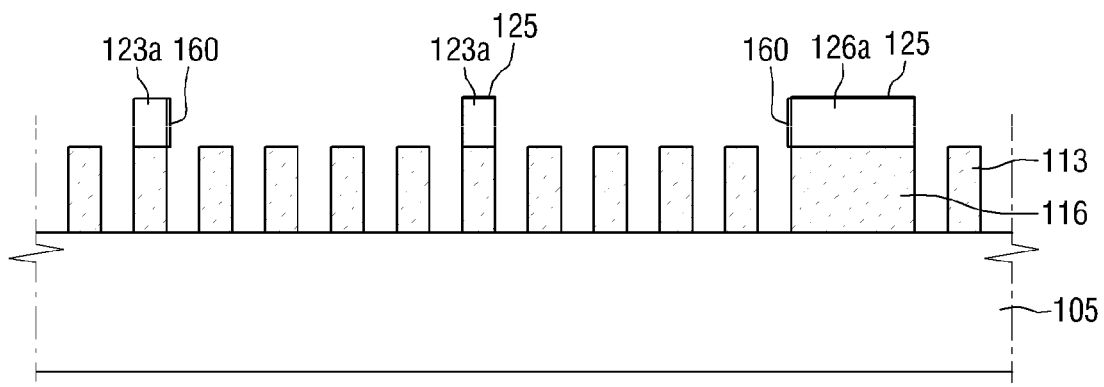
FIG. 17 is a vertical cross-sectional view of a wire grid polarizer according to another exemplary embodiment of the present inventive concept.

FIG. 17 is a vertical cross-sectional view of a wire grid polarizer according to another embodiment of the present inventive concept.

Referring to FIG. 17, a wire grid polarizer 100-1 may include the substrate 105, multiple conductive wire patterns 113 and reflective films 116 protruded from the substrate 105 and arranged in parallel with each other, and first residual guide patterns 123*a* and second residual guide patterns 126*a* disposed on a part of the conductive wire patterns 113 and a part of the reflective films 116, respectively. In this case, the first residual guide patterns 123*a* may be disposed on the conductive wire patterns 113, and the second residual guide patterns 126*a* may be disposed on the reflective films 116.

In this case, the first residual guide patterns 123a may be disposed on the conductive wire patterns 113 in a predetermined interval. Specifically, the conductive wire patterns 113 may be disposed on the conductive wire patterns 113 in a predetermined interval when monomer blocks 182 on the conductive wire patterns 113 are removed.

In this case, the surface treatment film 160 and the transfer layer 125 used for a surface treatment during the formation of the first and second residual guide patterns 123a and 126a may remain on a part of the first residual guide patterns 123a and a part of the second residual guide patterns 126a. Similarly to FIG. 1 to FIG. 9, the surface treatment film 160 and the transfer layer 125 may be disposed on the side surfaces and upper surfaces of the first and second guide patterns 123a and 126a, respectively, and may remain on a part of the side surfaces and a part of the upper surfaces of the first and second guide patterns 123a and 126a even after the process which will be performed later.

Figure 18:
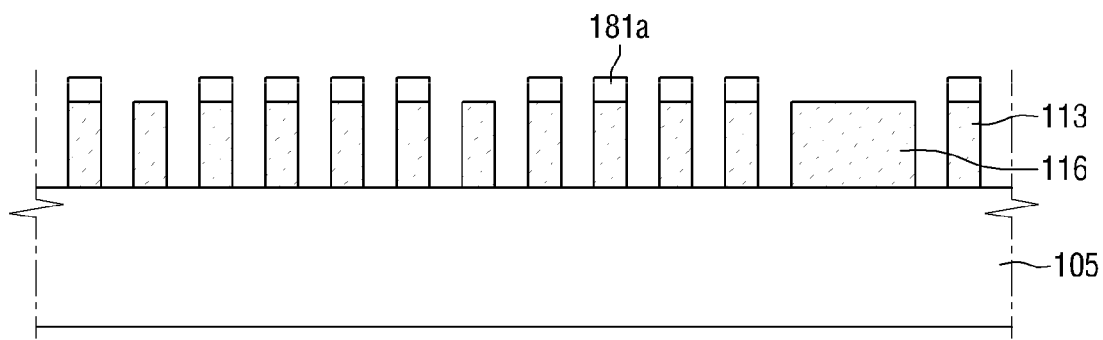
FIG. 18 is a vertical cross-sectional view of a wire grid polarizer according to yet another exemplary embodiment of the present inventive concept.

FIG. 18 is a vertical cross-sectional view of a wire grid polarizer according to yet another embodiment of the present inventive concept.

Referring to FIG. 18, a wire grid polarizer 100-2 may include the substrate 105, multiple conductive wire patterns 113 and reflective films 116 protruded from the substrate 105 and arranged in parallel with each other, and the residual monomer blocks 181a disposed on a part of the conductive wire patterns 113.

In this case, the residual monomer blocks 181a may be recursively and regularly disposed on the conductive wire patterns 113. Specifically, multiple residual monomer blocks 181a may be arranged in the vicinity of each other, and may be recursively arranged with the conductive wire pattern 113 which is disposed therebetween and on which no residual monomer block 181a is disposed.

In this case, the residual monomer blocks 181a are not formed on the conductive wire patterns 113 on which the first and second guide patterns were formed. The residual monomer blocks 181a are also not disposed on the reflective films 116 formed as the second guide pattern 126.

This may be done by performing a further process of removing a guide pattern to dispose regularly only the residual monomer blocks 181a, or by removing the first and second guide patterns during the etching process of forming the conductive wire patterns 113.

In this case, the first and second guide patterns may be removed after the step of aligning the block copolymer 180. This is because a smooth alignment of the block copolymer 180 is enabled and parallel defects caused by the overflow of the block copolymer 180 can be prevented only when the first and second guide patterns are removed after the annealing step for aligning the block copolymer 180.

Figure 19:
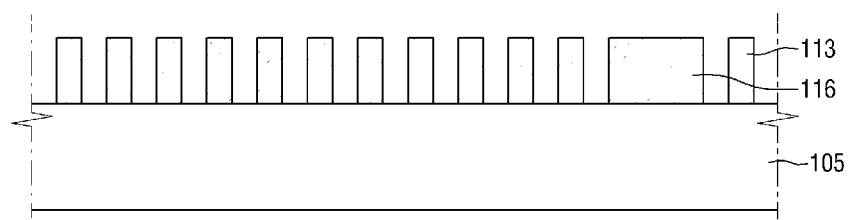
FIG. 19 is a vertical cross-sectional view of a wire grid polarizer according to still another exemplary embodiment of the present inventive concept.

FIG. 19 is a vertical cross-sectional view of a wire grid polarizer according to still another embodiment of the present inventive concept.

Referring to FIG. 19, a wire grid polarizer 100-3 may include the substrate 105, and multiple conductive wire patterns 113 and reflective films 116 protruded from the substrate 105 and arranged in parallel with each other.

The first and second residual guide patterns and the residual monomer blocks remaining on the conductive wire patterns 113 may be removed to leave only the conductive wire patterns 113 disposed at a predetermined spacing on the substrate 105.

Similarly to other embodiments of the present inventive concept, the step of removing the guide pattern may be performed after the step of aligning the block copolymer 180. This also is because a smooth alignment of the block copolymer 180 is enabled and parallel defects caused by the overflow of the block copolymer 180 can be prevented only when the first and second guide patterns are removed after the annealing step for aligning the block copolymer 180.

Figure 20:
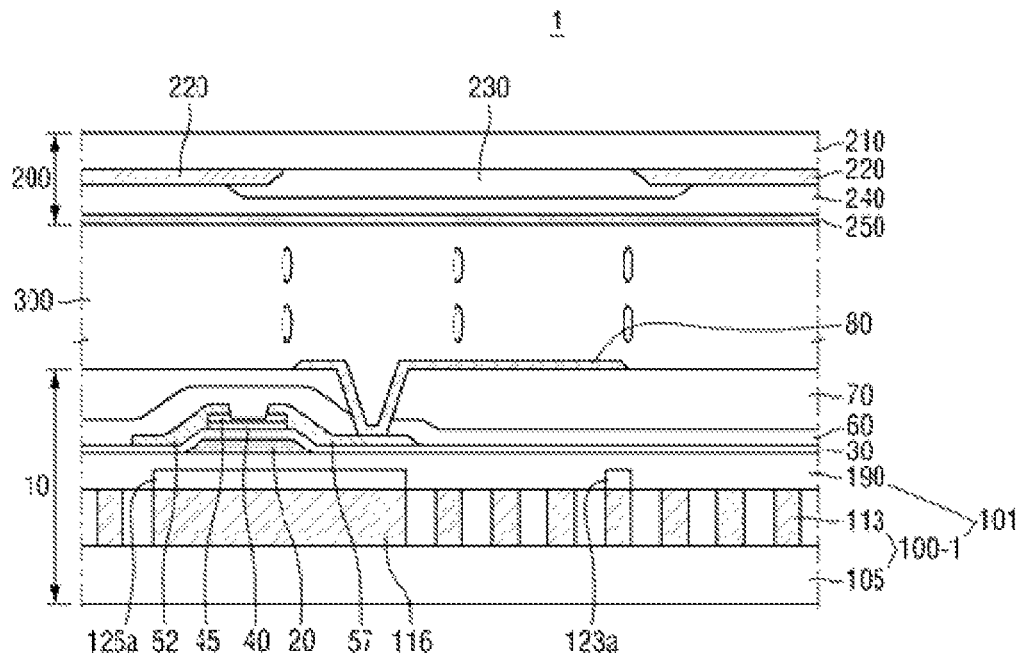
FIG. 20 is a schematic cross-sectional view of a display device including the wire grid polarizer according to an exemplary embodiment of the present inventive concept.

FIG. 20 is a schematic cross-sectional view of a display device including the wire grid polarizer according to an embodiment of the present inventive concept. In this case, the wire grid polarizer will be explained by citing FIG. 1 to FIG. 19.

Referring to FIG. 20, a display device 1 may include a first display substrate 10, a second display substrate 200 facing the first display substrate 10 with a spacing therebetween, and a liquid crystal layer 300 interposed between the first display substrate 10 and the second display substrate 200. A plurality of pixels are arranged into a matrix in each display substrate 10 and 200.

A plurality of gate lines extending in a first direction and a plurality of data lines extending in a second direction vertical to the first direction may be formed in the first display substrate 10. A pixel electrode 80 may be disposed in each of pixels defined by the gate lines and the data lines.

The pixel electrode 80 may be provided with a data voltage through a thin film transistor serving as a switching element. A gate electrode 20 serving as a control terminal of the thin film transistor may be connected to the gate line, a source electrode 52 serving as an input terminal of the thin film transistor may be connected to the data line, and a drain electrode 57 serving as an output terminal of the thin film transistor may be connected to the pixel electrode 80 via a contact hole. The thin film transistor may have a channel made of a semiconductor layer 40. An ohmic contact layer 45 having a high work function may be further formed between the semiconductor layer 40 and the source/drain electrodes 52 and 57. The ohmic contact layer 45 may have a high work function by doping a dopant to the semiconductor layer 40.

The semiconductor layer 40 may overlap the gate electrode 20. The source electrode 52 and the drain electrode 57 may be spaced apart from each other with the semiconductor layer 40 interposed therebetween. The pixel electrode 80 may cooperate with a common electrode 250 to generate an electric field to control the alignment direction of liquid crystal molecules of the liquid crystal layer 300 interposed between the pixel electrode 80 and the common electrode 250. The liquid crystal layer 300 may be in a twisted nematic (TN) mode having a positive dielectric anisotropy, a vertical alignment (VA) mode, a homogeneous alignment (IPS, FFS) mode or the like, however, the liquid crystal layer 300 is not limited thereto.

A color filter 230 may be formed in each pixel in the second display substrate 200. The color filter 230 may include red, green and blue filters 230. The red, green and blue filters 230 may be arranged alternately with each other. A light shielding pattern 220 may be disposed at each interface between the color filters 230. Furthermore, the light shielding pattern 220 may be disposed even in a non-display region of the second display substrate 200. The common electrode 250 may be disposed in the second display substrate 200, the common electrode 250 being built in the second display substrate 200 regardless of pixels.

The display device 1 will now be explained in more detail.

The first display substrate 10 may employ, as a base substrate, a wire grid polarizing substrate 101 having wire grid polarizers 100, 100-1, 100-2 and 100-3 as disclosed in FIGS. 1, 17, 18 and 19, respectively. Herein, although the wire grid polarizing substrate 101 having the wire grid polarizer 100-1 is described as a representative example, wire grid polarizing substrates having wire grid polarizers 100, 100-1, 100-2 and 100-3 according to another embodiment and yet another embodiment may also be employed.

The substrate 105 may be a transparent insulating substrate formed of glass, transparent plastic or the like.

The wire grid polarizing substrate 101 may include a protective film 190 formed on the wire grid polarizer 100-1 so as to protect and insulate the conductive wire pattern 113 and the reflective film 116.

The wire grid polarizer 100-1 may include multiple conductive wire patterns 113 and reflective films 116 protruded from the substrate 105, and first and second residual guide patterns 123*a* and 126*a* remaining in at least a part of the conductive wire patterns 113 and reflective films 116. A part of the first and second residual guide patterns 123*a* and 126*a* may include the surface treatment film (not shown) formed at the side surfaces thereof, or the transfer layer (not shown) formed on the upper surfaces thereof In the wire grid polarizing substrate 101, the reflective film 116 may be disposed in the region where the thin film transistor is arranged except the region where the conductive wire pattern 113 is formed. The region where the thin film transistor is arranged is a region that does not allow light to pass through, and is also called as a non-displaying region. Thus, the reflective film 116 with no conductive wire pattern 113 of the wire grid polarizer 100-1 may be disposed in the region corresponding to the non-displaying region. In this case, a metal material having high reflection rate may reflect light incident to the non-displaying region and recycle the reflected light in an aperture portion, thereby achieving improved luminance of the display device 1.

A gate line formed of a conductive material and the gate electrode 20 protruded therefrom may be formed on the protective film 190 of the wire grid polarizing substrate 101. Although not shown in the drawing, the gate line may extend to the non-display region and may form a gate pad in the non-display region.

The gate line and the gate electrode 20 are covered with a gate insulating film 30.

The semiconductor layer 40 and the ohmic contact layer 45 may be formed on the gate insulating film 30. The source electrode 52 branched off from the data line and the drain electrode 57 spaced apart from the source electrode 52 may be formed on the semiconductor layer 40 and the ohmic contact layer 45. Although not shown in the drawing, the data line may extend to the non-display region and may form a data pad in the non-display region.

A passivation film 60 which is a kind of an insulating film formed of an insulating material such as a silicon nitride film, a silicon oxide film, a silicon oxynitride film and the like may be formed on the source electrode 52 and the drain electrode 57, and an organic material film 70 formed of an organic material may be formed on the passivation film 60. The passivation film 60 and the organic material film 70 may extend to the non-display region. The passivation film 60 may be omitted.

The pixel electrode 80 formed of a conductive material may be formed in each pixel on the organic material film 70. The pixel electrode 80 may be electrically connected to the drain electrode 57 via a contact hole which is formed through the organic material film 70 and the passivation film 60 to expose the drain electrode 57. The pixel electrode 80 may be formed of indium tin oxide, indium zinc oxide, indium oxide, zinc oxide, tin oxide, gallium oxide, titanium oxide, aluminum, silver, platinum, chrome, molybdenum, tantalum, niobium, zinc, magnesium and an alloy or a lamination thereof Now, the second display substrate 200 will be explained. The second display substrate 200 employs a second substrate 210 as a base substrate. The second substrate 210 may be a transparent insulating substrate made of glass, transparent plastic or the like.

The light shielding pattern 220 is formed on the second substrate 210. The light shielding pattern 220 may extend to the non-display region.

The color filter 230 may be formed on the light shielding pattern 220 of the display region.

An over-coating layer 240 may be formed on the color filter 230 and the light shielding pattern 220. The over-coating layer 240 may extend to the non-display region.

The common electrode 250 may be disposed on the over-coating layer 240. The common electrode 250 may be formed of indium tin oxide, indium zinc oxide, indium oxide, zinc oxide, tin oxide, gallium oxide, titanium oxide, aluminum, silver, platinum, chrome, molybdenum, tantalum, niobium, zinc, magnesium and an alloy or a lamination thereof The common electrode 250 may be formed to cover the whole display region. However, the common electrode 250 may include a slit or an aperture in the display region.

The common electrode 250 may extend to a part of the non-display region, however, may not be formed near an edge of the second display substrate 200 so as to expose the over-coating layer 240.

The first display substrate 10 and the second display substrate 200 face each other with a predetermined cell gap therebetween. The liquid crystal layer 300 may be interposed between the first display substrate 10 and the second display substrate 200. Although not shown, an alignment film may be disposed on a surface of at least either the first display substrate 10 or the second display substrate 200 contacting the liquid crystal layer 300. The pixel electrode 80 in the first display substrate 10 and the common electrode 250 in the second display substrate 200 may face with each other so as to generate an electric field in the liquid crystal layer 300.

As described above, the wire grid polarizing substrate 101 may use metal to achieve high efficiency of light reflection, and thus may reflect the light from the light source. Therefore, the wire grid polarizing substrate 101 may create all light into single polarized light by recycling the light. The wire grid polarizing substrate 101 may be applied to the display device 1 to achieve improved light transmission efficiency and luminance Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of fabricating a wire grid polarizer, the method comprising:

sequentially forming a conductive layer on a substrate, a guide layer on the conductive layer, and a surface treatment protection layer on the guide layer;

patterning the surface treatment protection layer and the guide layer to form a first pattern in which a first surface treatment protection pattern is formed on a first guide pattern that partially exposes the conductive layer, and a second pattern in which a second surface treatment protection pattern is formed on a second guide pattern;

forming a surface treatment film on side surfaces and upper surfaces of the first and second patterns;

removing the first and second surface treatment protection patterns from the respective first and second patterns on which the surface treatment film is formed, to expose upper surfaces of the first and second guide patterns; and providing a block copolymer of two monomers having mutually different etch rates into a space defined by the conductive layer and the first and second guide patterns, wherein a transfer layer which is hydrophobic to the block copolymer of two monomers is formed on the upper surfaces of the first and second guide patterns.

2. The method of claim 1, further comprising, after providing a block copolymer of two monomers having mutually different etch rates into a space defined by the conductive layer and the first and second guide patterns, aligning the block copolymer of two monomers to form two monomer blocks;

selectively removing one of the two monomer blocks; and patterning the conductive layer using a residual monomer block and the first and second guide patterns as an etching mask to form a conductive wire pattern and a reflective film.

3. The method of claim 1, wherein the two monomers have mutually different etch rates and one of the two monomers is hydrophobic to the surface treatment film.

4. The method of claim 1, wherein the surface treatment protection layer is formed of a reverse crosslinkable material.

5. The method of claim 1, wherein the surface treatment protection layer is formed of a Cumarine-based material.

6. The method of claim 1, wherein the surface treatment protection layer is formed of water soluble polymer.

7. The method of claim 1, wherein the surface treatment protection layer is hydrophobic to both monomers of the block copolymer.

8. The method of claim 1, wherein the transfer layer is hydrophobic to both monomers of the block copolymer.

9. The method of claim 1, wherein aligning the block copolymer comprises heat annealing or solvent annealing the block copolymer.

10. The method of claim 1, wherein aligning the block copolymer comprises swelling the block copolymer, wherein the transfer layer prevents the swelled block copolymer from overflowing.

11. The method of claim 1, wherein the upper surface of the second pattern is wider than the upper surface of the first pattern.

12. The method of claim 1, the method further comprising reducing a width of the guide pattern, wherein reducing the width of the guide pattern is a trimming process including a plasma treatment.

13. A method of fabricating a wire grid polarizer, the method comprising:

forming the conductive layer on the substrate, forming the guide layer on the conductive layer, forming a surface treatment protection layer on the guide layer, forming a hard mask layer on the surface treatment protection layer, and forming a sacrificial layer on the hard mask layer;

forming a photoresist pattern on the sacrificial layer to expose a part of the sacrificial layer;

etching the sacrificial layer to form a sacrificial pattern, and exposing a part of the hard mask layer;

forming a mask material layer on the sacrificial pattern and the exposed hard mask layer;

etching the mask material layer to form a mask pattern, and exposing the sacrificial pattern and a portion of the hard mask layer;

etching the hard mask layer exposed beneath the mask pattern to form the hard mask pattern; etching the surface treatment protection layer and the guide layer exposed beneath the hard mask pattern to form first and second patterns including first and second guide patterns and first and second surface treatment protection patterns;

removing the first and second surface treatment protection patterns from the respective first and second patterns to expose upper surfaces of the first and second guide patterns; and providing a block copolymer of two monomers having mutually different etch rates into a space defined by the conductive layer and the first and second guide patterns, wherein a transfer layer which is hydrophobic to the block copolymer of two monomers is formed on the upper surfaces of the first and second guide patterns.

14. A wire grid polarizer comprising:

a substrate;

multiple conductive wire patterns and reflective films protruded from the substrate; and a first guide pattern formed on at least a part of the conductive wire patterns, and a second guide pattern formed on at least a part of the reflective films, wherein a surface treatment film is formed on at least a part of side surfaces of the first and second guide patterns, wherein a transfer layer is formed on at least a part of upper surfaces of the first and second guide patterns.

15. The wire grid polarizer of claim 14, further comprising a monomer block on at least a part of the conductive wire patterns.

16. The wire grid polarizer of claim 15, wherein the transfer layer is hydrophobic to the monomer block.

17. The wire grid polarizer of claim 14, wherein the upper surface of the second guide pattern is wider than the upper surface of the first guide pattern.

18. A display device comprising:

a protective film disposed on a wire grid polarizer;

a gate line formed on the protective film and extending in a first direction;

a data line insulated from the gate line and extending in a second direction;

a thin film transistor electrically connected to the gate line and the data line; and a pixel electrode electrically connected to the thin film transistor, wherein the wire grid polarizer comprises:

a substrate;

multiple conductive wire patterns and reflective films protruded from the substrate; and a first guide pattern formed on at least a part of the conductive wire patterns, and a second guide pattern formed on at least a part of the reflective films, wherein a surface treatment film is formed on at least a part of side surfaces of the first and second guide patterns, wherein a transfer layer is formed on at least a part of upper surfaces of the first and second guide patterns.

19. The display device of claim 18, further comprising a monomer block on at least a part of the conductive wire patterns.

20. The display device of claim 18, wherein the transfer layer is hydrophobic to the monomer block.

\* \* \* \* \*